United States Patent
Chiu et al.

(10) Patent No.: US 9,627,262 B2
(45) Date of Patent: Apr. 18, 2017

(54) METHOD OF PATTERNING FEATURES OF A SEMICONDUCTOR DEVICE

(71) Applicant: Taiwan Semiconductor Manufacturing Company, Ltd., Hsin-Chu (TW)

(72) Inventors: Wei-Chao Chiu, Hsinchu (TW); Chen-Yu Chen, Taipei (TW); Chih-Ming Lai, Hsinchu (TW); Ming-Feng Shieh, Yongkang (TW); Nian-Fuh Cheng, Hsinchu (TW); Ru-Gun Liu, Zhubei (TW); Wen-Chun Huang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/698,094

(22) Filed: Apr. 28, 2015

(65) Prior Publication Data
US 2015/0228542 A1 Aug. 13, 2015

Related U.S. Application Data

(63) Continuation of application No. 13/804,679, filed on Mar. 14, 2013, now Pat. No. 9,023,695.

(51) Int. Cl.
| | |
|---|---|
| *H01L 21/82* | (2006.01) |
| *H01L 21/8234* | (2006.01) |
| *H01L 21/308* | (2006.01) |
| *H01L 29/66* | (2006.01) |
| *H01L 29/78* | (2006.01) |
| *H01L 21/02* | (2006.01) |
| *H01L 21/306* | (2006.01) |
| *H01L 21/311* | (2006.01) |

(52) U.S. Cl.
CPC ........ *H01L 21/823431* (2013.01); *H01L 21/02238* (2013.01); *H01L 21/308* (2013.01); *H01L 21/3086* (2013.01); *H01L 21/30604* (2013.01); *H01L 21/31111* (2013.01); *H01L 21/31144* (2013.01); *H01L 29/6656* (2013.01); *H01L 29/66795* (2013.01); *H01L 29/785* (2013.01); *H01L 21/02255* (2013.01)

(58) Field of Classification Search
CPC ....... H01L 21/823431; H01L 29/66795; H01L 29/66818; H01L 29/785
USPC ..................................................... 438/165
See application file for complete search history.

(56) References Cited

U.S. PATENT DOCUMENTS

| | | | |
|---|---|---|---|
| 7,476,933 B2 | 1/2009 | Juengling | |
| 7,763,531 B2 | 7/2010 | Abadeer et al. | |
| 7,947,589 B2 * | 5/2011 | Muralidhar | H01L 21/3086 216/2 |
| 8,822,320 B2 | 9/2014 | Cheng et al. | |

(Continued)

*Primary Examiner* — Mark Prenty
(74) *Attorney, Agent, or Firm* — Haynes and Boone, LLP

(57) ABSTRACT

A method of semiconductor device fabrication including forming a mandrel on a semiconductor substrate is provided. The method continues to include oxidizing a region the mandrel to form an oxidized region, wherein the oxidized region abuts a sidewall of the mandrel. The mandrel is then removed from the semiconductor substrate. After removing the mandrel, the oxidized region is used to pattern an underlying layer formed on the semiconductor substrate.

20 Claims, 8 Drawing Sheets

(56) References Cited

U.S. PATENT DOCUMENTS

| | | | |
|---|---|---|---|
| 9,023,695 B2* | 5/2015 | Chiu | H01L 21/3086 438/157 |
| 2007/0205443 A1* | 9/2007 | Juengling | H01L 21/76229 257/288 |
| 2008/0149593 A1* | 6/2008 | Bai | H01L 21/02164 216/47 |
| 2011/0068431 A1 | 3/2011 | Knorr et al. | |

* cited by examiner

METHOD OF PATTERNING FEATURES OF A SEMICONDUCTOR DEVICE

CROSS-REFERENCE TO RELATED APPLICATIONS

This application is a continuation application of U.S. application Ser. No. 13/804,679, filed Mar. 14, 2013, entitled "METHOD OF PATTERNING FEATURES OF A SEMICONDUCTOR DEVICE," the entire disclosure of which is incorporated herein by reference.

BACKGROUND

The semiconductor integrated circuit (IC) industry has experienced rapid growth. Technological advances in IC materials, design, and fabrication tools have produced generations of ICs where each generation has smaller and more complex circuits than the previous generation. As semiconductor devices scale down, the ability to control device performance metrics such as leakage while maintaining manufacturable processes for a planar type transistor becomes difficult. One advance undertaken by the semiconductor industry is the development of multi-gate (e.g., dual-gate) transistors. Some of these devices may be known as fin-type field effect transistors (FinFETs) when their structure includes a thin "fin" extending from a substrate. A typical FinFET is fabricated on a substrate with an overlying insulating layer with a thin 'fin' extending from the substrate, for example, etched into a silicon layer of the substrate. The channel of the FET is formed in this vertical fin. A gate is provided over (e.g., wrapping) the fin. A double gate is beneficial in that it allows for gate control of the channel from both sides. Further advantages of FinFETs include reducing the short channel effect and higher current flow.

In the course of these advances, efforts have been made to develop fabrication methods to realize the desire for smaller feature sizes. For example, methods have been developed that reduce the pitch of features on a substrate without changing the photolithography technology used. Double Patterning Lithography (DPL) techniques are such methods. One such method is forming spacers on a sacrificial line features. However, there are disadvantages to this and other conventional method, for example, variations in the spacer structures (e.g., sidewalls), challenges with etching the line features, and maintaining etch selectivity between line features, spacers, and/or other layers formed on the substrate. Thus, while the present methods are suitable for some intended purposes, benefits would be gained from improved fabrication methods.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

It will also be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. As used herein, the singular forms "a," "an" and "the" are intended to comprise the plural forms as well, unless the context clearly indicates otherwise. Finally, the present disclosure illustrates its application to forming fin elements such as used for a FinFET transistor. However, one of ordinary skill in the art would recognize that other features including of other device types may also benefit from the present disclosure. For example, the patterning methods disclosed herein may be used to form gate structures and/or other features of a semiconductor device where a decrease in pattern pitch or feature size is desired.

Figure 1:
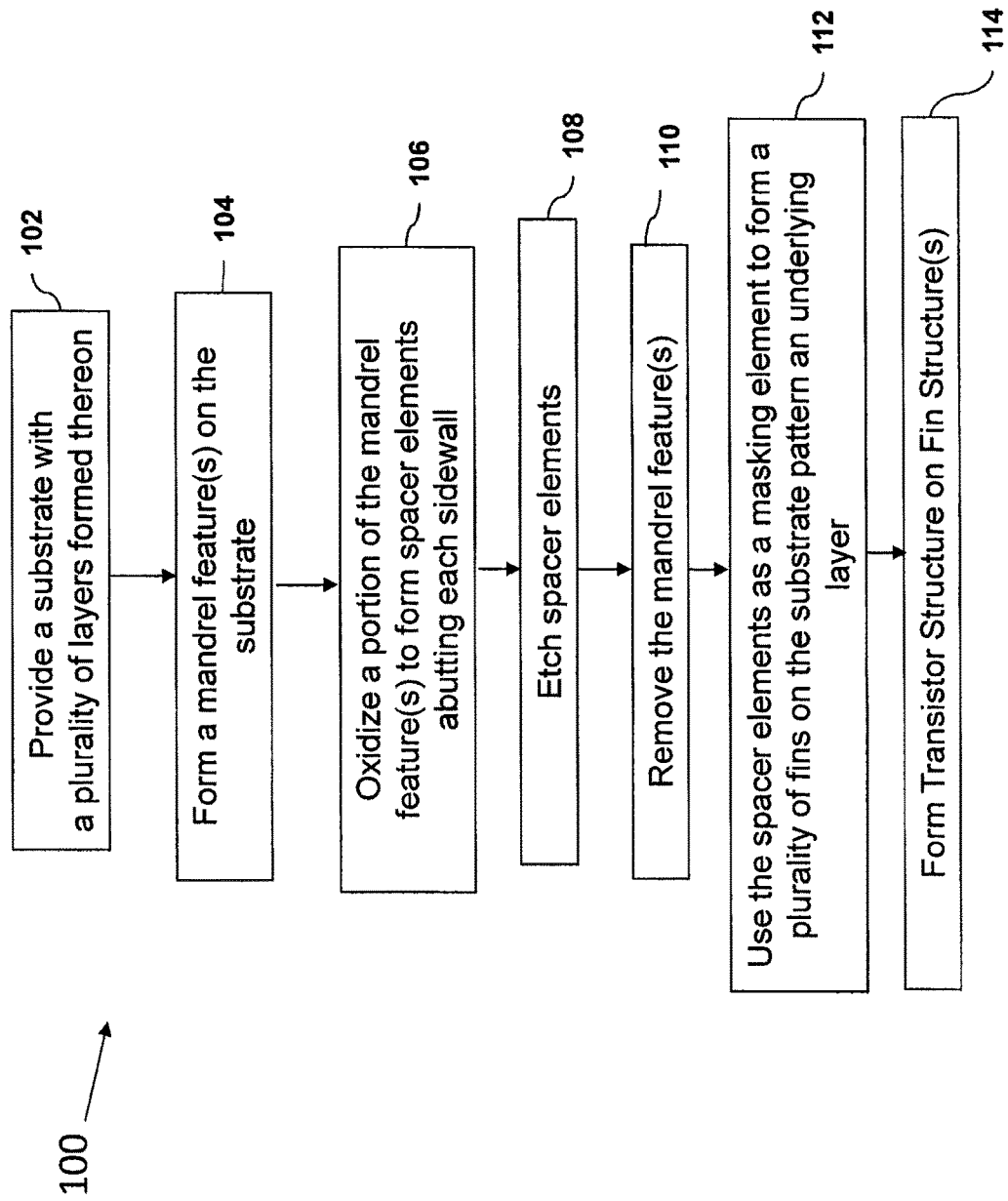
FIG. 1 is an embodiment of a method of fabricating features of a semiconductor device according to one or more aspects of the present disclosure.

FIG. 1 illustrates a method 100 for fabricating a plurality of features on a semiconductor substrate. In an embodiment, the plurality of features is fin structures of a FinFET device. FIGS. 2-8 are cross-sectional views of an embodiment of a device 200 fabricated according to the method 100 of FIG. 1. It should be understood that FIGS. 2-8 and the device 200 are representative and exemplary only. In an embodiment, the semiconductor device 200 is a FinFET device or portion thereof.

Further, it is understood that the method 100 includes steps having features of a complementary metal-oxide-semiconductor (CMOS) technology process flow and thus, are only described briefly herein. Additional steps may be performed before, after, and/or during the method 100. It is also understood that parts of a semiconductor device 200, illustrated in FIGS. 2-8, may be fabricated by complementary metal-oxide-semiconductor (CMOS) technology process flow, and thus some processes are only briefly described herein. Further, the semiconductor device 200 may include various other devices and features, such as additional transistors, bipolar junction transistors, resistors, capacitors, diodes, fuses, etc., but is simplified for a better understanding of the inventive concepts of the present disclosure. The semiconductor device 200 includes a plurality of semiconductor devices (e.g., transistors), which may be interconnected.

For example, the device 200 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. In an embodiment, the semiconductor device described in FIGS. 1-8 includes a transistor. In an embodiment, the transistor is a field effect transistor (FET) such as a FinFET (multi-gate transistor) device, or portion thereof. However, one or ordinary skill in the art may recognize other devices including other transistors that may be formed using the patterning methods described herein.

In FIG. 1, illustrated is the method 100 for fabricating a plurality of features on a semiconductor substrate. In an embodiment, the method 100 fabricates a plurality of fin structures suitable to provide a fin or channel region of a FinFET. In a further embodiment, the method 100 provides for forming fin structures at a pitch that is beyond the optical resolution of a lithography tool used to fabricate the device. Exemplary technology nodes that may implement the method 100 include, but are not limited to, sub-20 nanometer (nm) nodes.

The method 100 begins at block 102 where a substrate having a plurality of layers is provided. The substrate may be a semiconductor substrate, such as a semiconductor wafer. The substrate may include silicon in a crystalline structure. In alternative embodiments, the substrate may include germanium, silicon germanium, silicon carbide, gallium arsenide, indium arsenide, indium phosphide, and/or other suitable materials.

The substrate further comprises one or more layers formed on the semiconductor substrate. Examples of layers that may be formed include insulator layers, epitaxial layers, additional semiconductor layers, and/or other suitable layers. In an embodiment, the substrate is a silicon-on-insulator (SOI) substrate.

Figure 2:
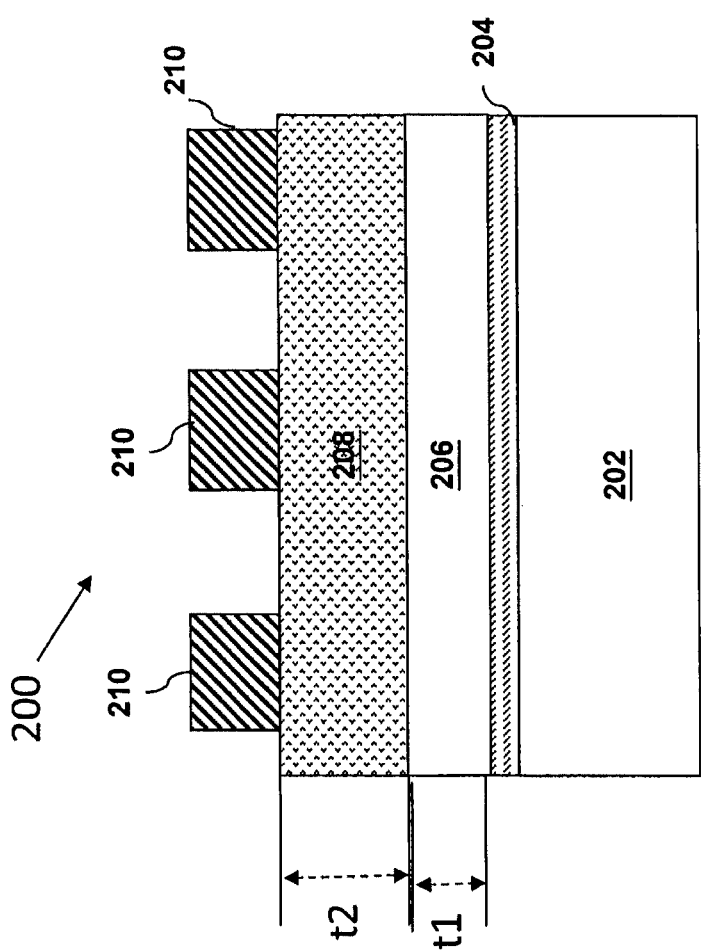
FIGS. 2-8 are cross-sectional views of an embodiment of a semiconductor device fabricated according to one or more steps of the method of FIG. 1.

Referring to the example of FIG. 2, a semiconductor substrate 202 having layers 204, 206, and 208 disposed thereon is illustrated. In an embodiment, the semiconductor substrate 202 includes silicon. Alternatively, the substrate 202 may include germanium, silicon germanium, silicon carbide, gallium arsenide, indium arsenide, indium phosphide, and/or other suitable materials.

A thin pad layer 204 is disposed on the substrate 202. The pad layer 204 may be a pad oxide layer. The pad oxide thickness may be less than approximately 40 Angstroms (Å). In an embodiment, the pad layer 204 is provided to improve the interface of the semiconductor substrate 202 and an overlying layer (e.g., insulator layer 206), for example, reducing the stress between layers and thus, potential deformation of layer(s).

An insulator layer 206 is formed on the pad oxide layer 204. The insulator layer 206 may include a nitride material such as, for example, silicon nitride. The thickness t1 of the insulator layer 206 may be less than approximately 500 Å. In a further embodiment, the thickness t1 of the insulator layer 206 may be between approximately 100 Å and approximately 400 Å. In some embodiments, the thickness of the insulator layer(s) formed between the semiconductor substrate and an overlying semiconductor layer is advantageous, for example, being thinner than conventional embodiments and/or allowing for the omission of an additional insulator layer typically used in the conventional embodiments. This is discussed in further detail below.

A mandrel layer 208 is disposed on the insulator layer 206. The mandrel layer 208 may be a sacrificial layer. In an embodiment, the mandrel layer 208 is a semiconductor layer having a single crystalline or polycrystalline structure. For example, the mandrel layer 208 may include single-crystalline silicon, polycrystalline silicon, and/or other suitable materials. The mandrel layer 208 may have a thickness t2 of less than approximately 500 Å. In an embodiment, the thickness t2 of the mandrel layer 208 may be between approximately 100 Å and approximately 500 Å. In some embodiments, the thickness of the mandrel layer 208 (and therefore the resultant mandrels as discussed below) is thinner than that of conventional embodiments. This may be advantageous in allowing for a decrease in the severity of the high aspect ratio (HAR) etch that is used to etch the layer to form mandrels. This is discussed in further detail below.

One or more of the layers 204, 206, and/or 208 may be formed using conventional processes known in the art such as, chemical vapor deposition (CVD), oxidation, physical vapor deposition (PVD), plasma enhanced CVD (PECVD), atmospheric pressure CVD (APCVD), atomic layer deposition (ALD), low pressure CVD (LPCVD), high density plasma CVD (HDPCVD), atomic layer CVD (ALCVD), thermal oxidation, and/or other suitable processes.

The method 100 then proceeds to block 104 where a mandrel (e.g., a sacrificial or dummy feature) is formed on the substrate. Typically, a plurality of mandrels is formed on the substrate. The mandrels may be formed using suitable patterning techniques such as photolithography processes. For example, photosensitive material (e.g., photoresist) is formed on the substrate. The photoresist in then exposed to a pattern using suitable radiation having passed through a photomask. The patterned resist is then used as a masking element to etch mandrels in a layer (e.g., mandrel layer) formed on the substrate. After forming a masking element of the photoresist, the mandrels may be etched using suitable etching processes such as dry etch, plasma etch, reactive ion etching, ion beam etching, and/or other suitable techniques. It is noted that the etch may be a low(er)-aspect ratio etch, for example, at a ratio of approximately 1.25 to approximately 1. This aspect ratio may be provided by a decreased thickness mandrel layer as compared to other embodiments. Alternatively, other processes may be used to pattern mandrels on the substrate.

Referring to the example of FIG. 2, a plurality of photoresist elements 210 are disposed on the mandrel layer 208. The plurality of photoresist elements 210 has a pitch. A pitch, for purposes of this disclosure, includes the width of one feature plus the width of one space to the following feature. This metric may also be expressed as line/space where "line" includes the width of any feature (e.g. a line), and space includes the width of one space. The pitch of the elements 210 may be defined by a lithography tool and process as discussed above.

Figure 3:
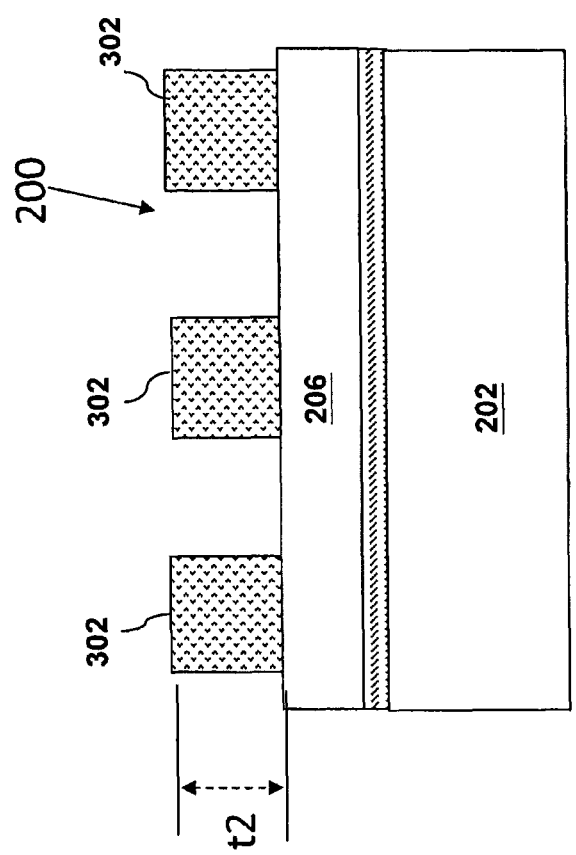

Referring now to FIG. 3, the pattern defined by the photoresist elements 210 has been transferred to the mandrel layer 208 (FIG. 2) to form mandrels 302. The mandrels 302 may have a height that is substantially similar to the thickness of the mandrel layer 208, t2. The mandrels 302 have a pitch or line/space defined by the photoresist elements 210. Thus, in an embodiment, the line/space of the mandrels 302 is equal to or greater than an optical limit of a photolithography process used in fabricating the device 200.

The method 100 then proceeds to block 106 where a portion of the mandrel is oxidized. The oxidation forms an oxidized region on the exposed surfaces of the mandrel. For example, the oxidized region forms on the sidewalls of each mandrel feature thus, forming spacer elements abutting the sidewalls of each of the mandrel features. The oxidized region may also be formed on a top surface of the mandrel and/or end cap surfaces.

The oxidized region includes an oxide of the composition of the mandrel. Thus, in an embodiment, the oxidized region is an oxide such as silicon oxide. In an embodiment, the oxidized region is between approximately 100 Å and approximately 300 Å in thickness. The oxidation may be performed by a thermal oxidation of the mandrel material. Exemplary thermal oxidation processes include exposing the device to an oxygen, nitric oxide, nitrous oxide, or steam ($H_2O$) environment. The environment may be a wet environment or a dry environment. The thermal oxidation may be performed at a temperature between approximately 700 and approximately 900 degrees Celsius. Exemplary thermal oxidation processes include those processed for between approximately 5 and approximately 20 minutes.

Figure 4:
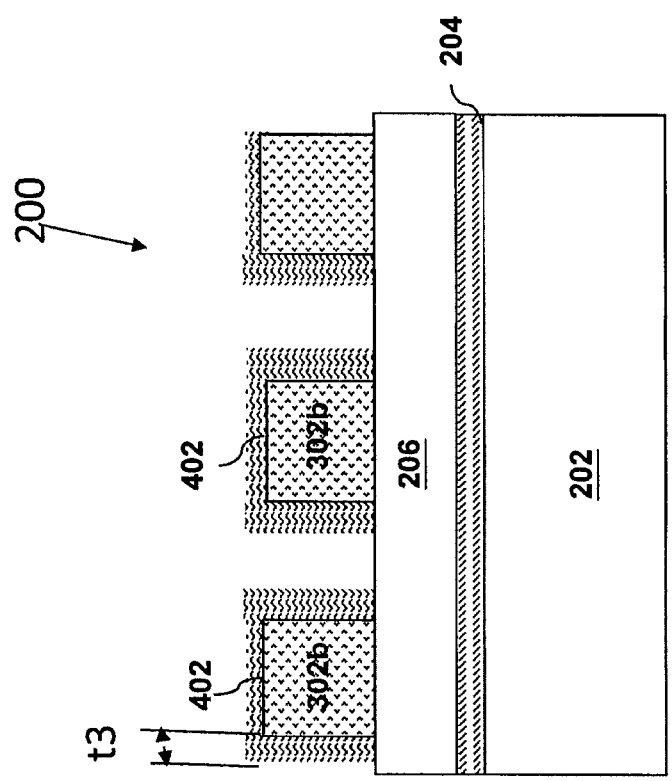

Referring to the example of FIG. 4, the mandrels 302 (FIG. 3) have been partially oxidized leaving mandrel 302*b* (decreased in width/height of the semiconductor material of the mandrel 302). An oxidized region 402 of the mandrel is formed using an oxidation process such as discussed above. The oxidized region 402 has a thickness t3. The thickness t3 may be between approximately 100 Å and approximately 300 Å. The oxidized region 402 is an oxide of the material comprising the mandrels 302. In an embodiment, the oxidized region 402 is silicon oxide; the mandrels 302/302*b* including silicon.

The method 100 then proceeds to block 108 where the oxidized region is etched to provide spacer elements abutting the sidewalls of the mandrel. In an embodiment, the oxidized material is removed from a top surface of the mandrel features. In an embodiment, the oxidized material is removed from end caps of the mandrel features (e.g., opposing ends not shown). The etching process may also remove a portion of the material of the spacer element disposed on the sidewalls of the mandrel feature. The etching process of block 108 may include suitable anisotropic etching processes such as, for example, plasma etching, reactive ion etching (RIE), ion beam etching, and/or suitable etching techniques.

Figure 5:
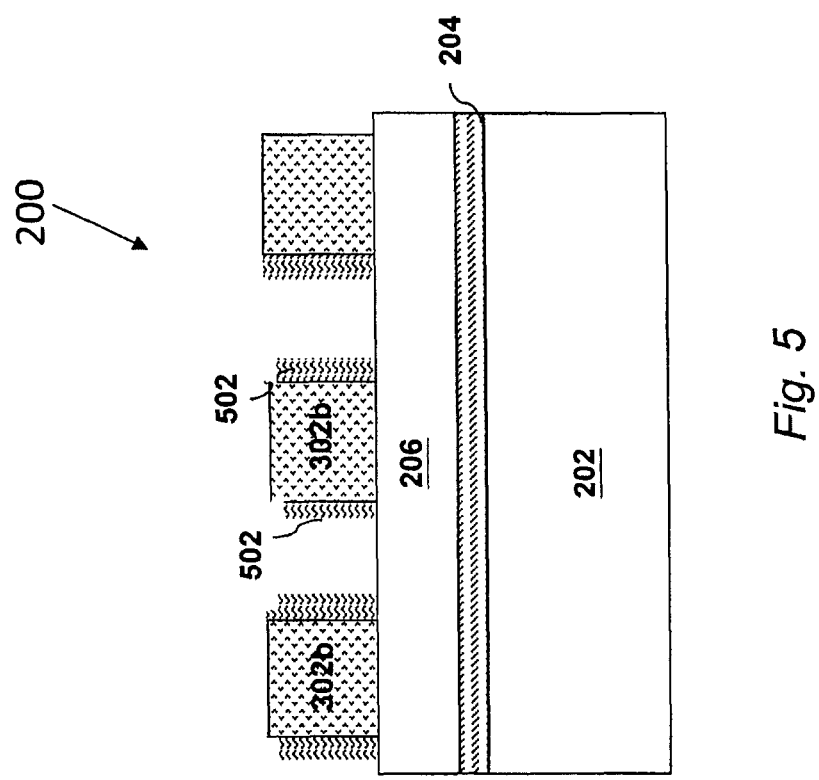

Referring to the example of FIG. 5, the oxidized region 402 is etched back to provide spacer elements 502 abutting the sidewalls of mandrels 302*b*. As illustrated, the etch back process may provide for a small amount of material loss of the spacer elements formed on the sidewalls of the mandrels 302*b* including at a top region of the spacer (e.g., adjacent a top surface of the mandrel 302*b*).

The formation of spacer elements by oxidation of the mandrel can provide benefits. For example, the formed spacer elements are self-aligned to the mandrels as the oxidation occurs in a substantially conformal manner on all exposed mandrel surfaces. Further, the formed spacer elements may be of substantially uniform thickness/width as the oxidation is substantially conformal.

The method 100 then proceeds to block 110 where the mandrel(s) are removed from the substrate. The removal of the mandrel(s) provides a pattern of spacer elements. The mandrels may be removed by performing a wet etch or dry etch process. Exemplary wet etch processes include a standard clean 1 (SC-1) including ammonium hydroxide ($NH_4OH$), hydrogen peroxide ($H_2O_2$), and water ($H_2O$). Exemplary dry etch processes include plasma etching, reactive ion etching (RIE), ion beam etching, and/or other suitable techniques.

Figure 6:
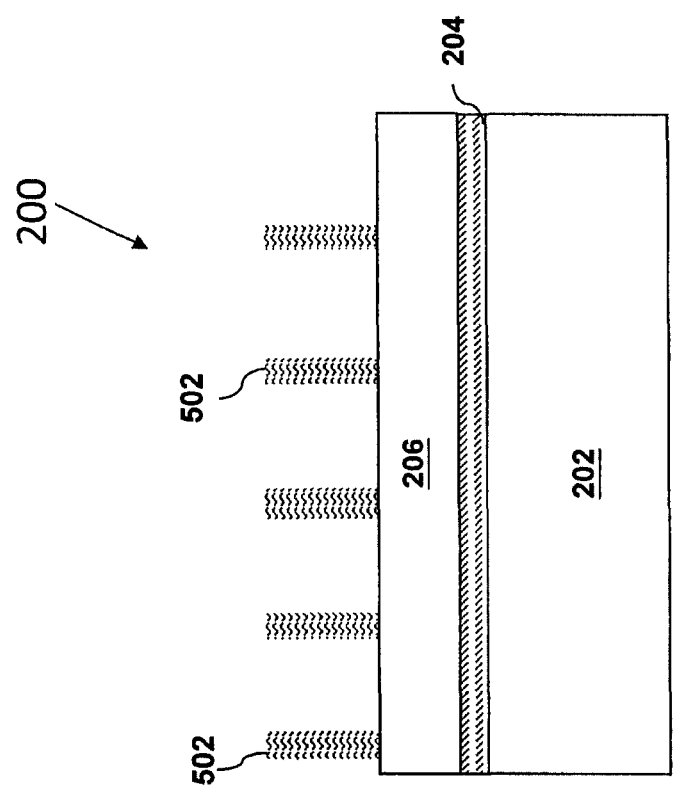

Referring to the example of FIG. 6, the mandrels 302*b* have been removed from the substrate 202. The spacer elements 502 remain on the insulating layer 206.

The formation of spacer elements by oxidation of the mandrel and subsequent removal of the mandrel can provide benefits. For example, the formed spacer elements are provided with steep profiles (e.g., linear sidewalls) transferred from the mandrels sidewall profile. This may provide more substantially linear and vertical (with respect to a top surface of the substrate) sidewalls than the formation of spacer elements by typical deposition and etching techniques. In an embodiment, the sidewalls of the spacer elements such as elements 502 are substantially vertical such that they are greater than approximately 75 degrees with respect to a top surface of the substrate 202. In an embodiment, the sidewalls of the spacer elements, such as elements 502, are substantially vertical such that the sidewalls deviate no more than approximately 15 degrees from a perpendicular line drawn with respect to a top surface of the substrate 202.

In an embodiment, the etching process of block 108 may be used for a trimming process posterior to formation of spacer elements. A trimming process may include an etching process that decreases the thickness of the spacer elements, such as elements 502 illustrated in FIG. 6. A trimming process may provide for a spacer element having a decreased width and as such, a thinner fin structure as described below.

The method 100 then proceeds to block 112 where the spacer elements are used as a masking element to form a plurality of features on the substrate and/or underlying layers. In an embodiment, the features formed are fin structures on the substrate. The fin structures may be formed by sequentially etching the layer(s) formed on the substrate such as by anisotropic etching processes. Suitable anisotropic etching processes include plasma etching, reactive ion etching, ion beam etching, and/or other suitable techniques. The etchings may occur in-situ. For example, the etching of one or more layers and/or the substrate may occur in the same processing chamber without intervening processes. The resultant fin structures may be fins provided in the semiconductor substrate (e.g., composed of semiconductor material) and extending from the substrate.

Figure 7:
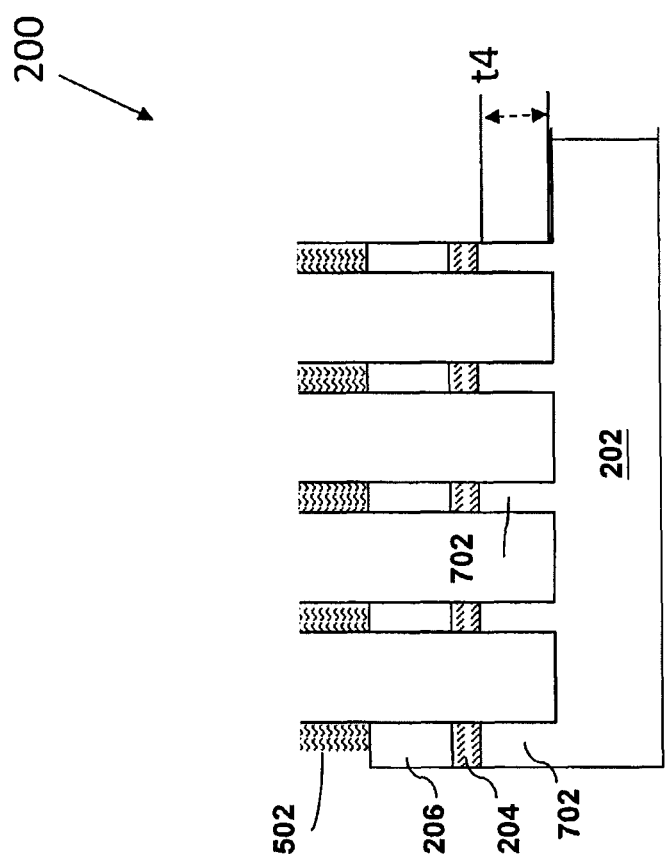

Referring to the example of FIG. 7, layers 206, 204, and the substrate 202 have been etched according to the pattern provided by the spacer elements 502. In an embodiment, the spacer elements 502 act as a masking element or hard mask for etching the insulating layer 206. The etching insulating layer 206 may in turn act as a masking element or hard mask for etching of the substrate 202. These etches may be performed in-situ or separate etching processes. The etching may include plasma etching, reactive ion etching, ion beam etching, and/or other suitable techniques.

The substrate 202 has been etched forming fin structures 702. The fin structures 702 may have a height t4 between approximately 500 Å and approximately 2000 Å. In an embodiment, the fin structures 702 include silicon.

It is noted that in an embodiment, the height of the fin structures 702 may be substantially uniform. This may be one advantage of an embodiment of a method using an oxidized portion of a mandrel to form the spacer elements 502. This method can provide a substantially linear and vertical (relative to a top surface of the substrate 202) sidewall and uniform spacer element 502. This substantially linear vertical sidewall can allow for uniform etching of the underlying layer(s) and substrate. In an embodiment, the difference in height of the fin structures such as fin structures 702 is less than approximately 6 nanometers (nm).

Figure 8:
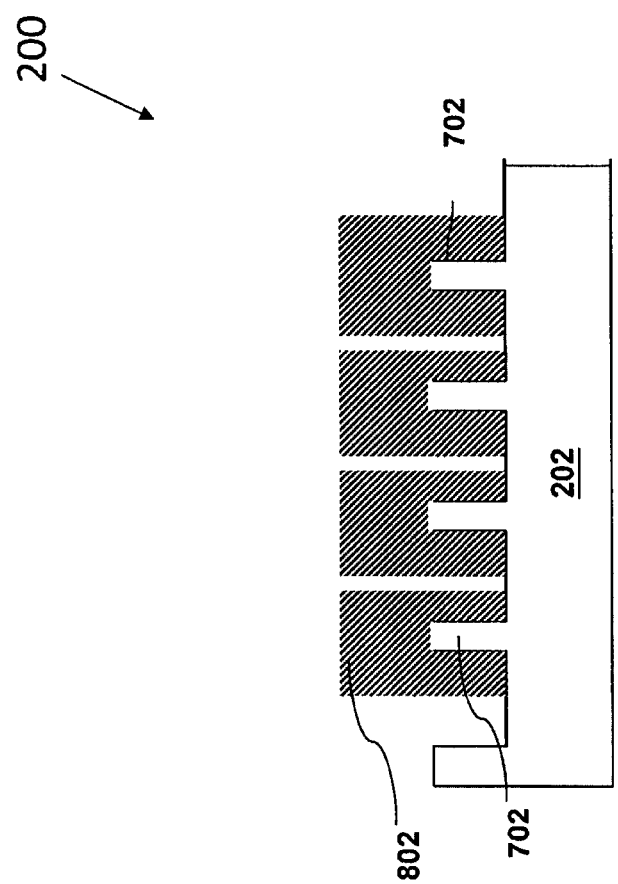

The method 100 then proceeds to block 114 where a transistor structure is formed on the fin structures. The transistor structure may include a gate structure, a source, and/or a drain. Illustrated in FIG. 8 is a gate structure 802 disposed on each of the fins 702. A channel region associated with the gate structure 802 is disposed in the fin 702. It is noted that FIG. 8 is exemplary and that various structures for a gate formed on fin 702 may be possible including dual-gate structures, tri-gate structures, and/or other suitable multi-gate features. In an embodiment, isolation material is disposed around the fin. In a further embodiment, the isolation material provides for a planar surface allowing one or more planar transistors to be formed on the fin structure 702. A source/drain region may also be formed in and/or around the fin structures 702.

A gate structure 802 may include a gate dielectric layer and/or a gate electrode. The gate dielectric layer may include a dielectric material such as, silicon oxide, silicon nitride, silicon oxy-nitride, dielectric with a high dielectric constant (high k), and/or combinations thereof. Examples of high k materials include hafnium oxide, zirconium oxide, aluminum oxide, hafnium dioxide-alumina ($HfO_2$—$Al_2O_3$) alloy, or combinations thereof. The gate dielectric layer may be formed using conventional processes such as, photolithography, oxidation, deposition, etching, and/or a variety of other processes known in the art.

In an embodiment, the gate electrode includes polysilicon. In a further embodiment, a first gate structure 802 is formed may include a sacrificial gate dielectric layer and/or a sacrificial gate electrode; this gate structure may be subsequently removed from the substrate and a metal gate electrode formed in its place using replacement gate methodologies known in the art.

In an embodiment, the gate structure 802 is a metal gate structure may include interfacial layer(s), gate dielectric layer(s), work function layer(s), fill metal layer(s) and/or other suitable materials for a metal gate structure. In other embodiments, the metal gate structure may further include capping layers, etch stop layers, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), CVD, and/or other suitable dielectric. The gate dielectric layer may include silicon dioxide or other suitable dielectric. In an embodiment, the gate dielectric is a high-k dielectric layer. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material. The gate dielectric layer may be formed by atomic layer deposition (ALD), chemical vapor deposition (CVD), physical vapor deposition (PVD), and/or other suitable methods.

Exemplary p-type work function metals that may be included in the gate structure include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structure include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, PVD, and/or other suitable process. A fill metal layer may overly the work function layer and include Al, W, or Cu and/or other suitable materials. The fill metal may be formed by CVD, PVD, plating, and/or other suitable processes. The fill metal may be deposited over the work function metal layer(s), dielectric and/or other layers of the gate structure and thereby fill in the remaining portion of the trenches or openings formed by the removal of the dummy gate electrode. Subsequent processes include providing a contact feature to the gate structure.

Thus, provided herein are methods that include forming a first pattern defining a configuration of elements used to form mandrel or sacrificial line structures. Spacer elements may then be formed on the sidewalls of these mandrels (e.g., abutting the sacrificial line structure). In the present disclosure, the spacer elements are formed by oxidizing a portion of the mandrel to provide an oxidized region. The oxidized region abutting the sidewalls of the mandrel(s) provide spacer elements of a desired width. The width and pitch of the spacer elements may define the width and the pitch of features of a resultant device such as a transistor element. Examples of the features that may be defined by the formed spacer elements are fins of a FinFET transistor. Thus, the width and pitch of the spacer elements may be provided at less than the minimum critical dimension of the photolithography process utilized (e.g., a half critical dimension process).

The methods and devices disclosed herein provide for an improved manner of forming spacer elements used as a masking element to pattern an underlying layer(s). In doing so, the present disclosure offers several advantages over prior art devices. Advantages of some embodiments of the present disclosure include forming spacer structures having a uniform structure due to the self-aligned nature of oxidation process and forming spacer structures having a substantially linear and vertical sidewall again due to the oxidation of the sidewalls of the mandrel feature as opposed to formation of features by separate deposition and etching processes. The improvement in the structure of the spacer elements may translate to an improvement in the structure of the formed fins, for example, the fin structures may be of a substantially uniform depth. In an embodiment, a benefit of a decrease in the high aspect ratio etching required to etch fin structures is experienced. This may be on account of thinner mandrel layer (e.g., lower height mandrels) being required. In some embodiments, the height of the mandrel may be decreased because of etch selectivity between the oxidized spacer element and the underlying insulator layer (e.g., nitride). In some embodiments, a decrease in the number of layers of insulator formed on the substrate underlying the mandrel is possible. For example, device 200 illustrates a single layer 206 underlying the mandrels 502. The layer 206 (e.g., nitride) can provide good etch selectivity to the oxidized regions of the mandrel (e.g., silicon oxide) thus allowing for less loss of the oxidized region during their use as a masking element. It is understood that different embodiments disclosed herein offer different disclosure, and that they may make various changes, substitutions and alterations herein without departing from the spirit and scope of the present disclosure.

Thus, it will be appreciated that in one of the broader embodiments discussed herein described is a method of semiconductor device fabrication including forming a mandrel on a semiconductor substrate. The method continues to include oxidizing a region of the mandrel to form an oxidized region, wherein the oxidized region abuts a sidewall of the mandrel. The mandrel is then removed from the semiconductor substrate. After removing the mandrel, the oxidized region is used to pattern an underlying layer formed on the semiconductor substrate.

In a further embodiment, the method includes forming the underlying layer on the semiconductor substrate. The underlying layer may include a nitride insulating material. In an embodiment, forming the mandrel includes forming the mandrel directly on the nitride insulating material. In an embodiment, the method includes using the patterned underlying layer to form a plurality of fin structures in the semiconductor substrate.

In another embodiment of the method described above, the oxidizing of the mandrel includes forming an oxidized region on a top surface of the mandrel. An etching process may then be performed to remove the oxidized region on the top surface of the mandrel before removing the mandrel.

In another embodiment, the oxidizing step in the method includes forming the oxidized region abutting the sidewall of the mandrel to have a thickness or width of between approximately 100 angstroms (Å) and approximately 300 Å. The oxidized region may be used to define a width of a fin structure for a transistor.

In another of the broader forms of the methods described herein, a method of fabricating a semiconductor device includes providing a substrate having a semiconductor material and an insulator layer disposed on the semiconductor material. A silicon mandrel structure is then formed on the insulator layer. The silicon mandrel structure has a top surface and two opposing sidewall surfaces. An oxide spacer is formed on each of the two opposing sidewall surfaces of the silicon mandrel structure. The oxide spacer is formed by oxidizing a portion of the silicon mandrel structure. The oxide spacer may then be used to pattern at least one of the insulator layer and the semiconductor material.

In a further embodiment, after forming the oxide spacers, the silicon mandrel structure is removed. The method may also include, after patterning the semiconductor material, forming a channel of a fin-type field effect transistor (FinFET) in the patterned semiconductor material. The oxidizing may be a thermal oxidation including an environment of at least one of oxygen, nitrous oxide, nitric oxide, and steam.

In a further embodiment, the method includes removing the silicon mandrel structure prior to using the oxide spacer to pattern and the oxidizing includes forming an oxidized region on the top surface of the silicon mandrel structure. The oxidized region on the top surface may be removed prior to removing the mandrel.

In one embodiment, the insulator layer is less than approximately 400 Angstroms. In an embodiment, forming the silicon mandrel includes depositing a mandrel material layer having a thickness of less than approximately 500 Angstroms. The oxidation process to form the oxide spacer may provide a width between approximately 100 Angstroms and approximately 300 Angstroms of the oxide spacer.

In another of the broader forms of the methods described herein, a method includes providing a semiconductor substrate having an insulating layer formed thereon. A plurality of mandrels is formed on the insulating layer. The semiconductor substrate having the plurality of mandrels is exposed to a thermal oxidation process. The thermal oxidation process forms an oxidized spacer element abutting a sidewall of each of the plurality of mandrels. The mandrels may then be removed from the semiconductor substrate and the oxidized spacer element used as a masking element to pattern the insulating layer. The patterned insulating layer may then be used as a masking element to etch fin structures in the semiconductor substrate.

In a further embodiment of the method, a gate structure is formed on each of the fin structures. The method may further include etching the oxidized spacer element before removing the plurality of mandrels. The thermal oxidation process may include at least one of exposing the plurality of mandrels to an oxygen, nitric oxide, nitrous oxide, or steam environment.

What is claimed is:

1. A method, comprising:
    forming a plurality of mandrel structures on a substrate, wherein the plurality of mandrel structures have a substantially equal pitch;
    oxidizing each of the plurality of the mandrel structures to form an oxidized region on each mandrel of the plurality of mandrels wherein the oxidized region is disposed on each of two opposing sidewalls, a top surface, and opposing end cap surfaces of each residual mandrel structure of the plurality of mandrels, the residual mandrel structure remaining after the oxidizing process;
    etching the oxidized regions to form a plurality of oxide spacers disposed at a substantially equal pitch, wherein the plurality of oxide spacers are formed on each of the two opposing sidewall surfaces of each residual mandrel structure, and wherein the etching removes the oxidized region from the top surface of each of the residual mandrel structures and removes the oxidized region from the end caps of each of the residual mandrel structures; and
    using the plurality of oxide spacers to pattern an underlying layer.

2. The method of claim 1, further comprising:
    after forming the oxide spacers, removing the residual mandrel structure.

3. The method of claim 1, further comprising:
    using the underlying layer to pattern a fin of a fin-type field effect transistor (FinFET).

4. The method of claim 3, further comprising:
    forming a gate structure on the fin; and
    forming a channel in the fin of the fin-type field effect transistor (FinFET).

5. The method of claim 1, wherein the oxidizing is a thermal oxidation including an environment of at least one of oxygen, nitrous oxide, nitric oxide, and steam.

6. The method of claim 1, wherein the using the oxide spacers to pattern the underlying layer includes patterning a fin element in a semiconductor layer.

7. The method of claim 1, wherein the using the oxide spacers to pattern the underlying layer includes: etching the underlying layer of an insulating layer, wherein the insulating layer interfaces the oxide spacers; thereafter, etching a pad oxide layer under the underlying layer, wherein the pad oxide layer interfaces the insulating layer.

8. The method of claim 1, further comprising:
    performing a trim process on the oxide spacers prior to using the oxide spacers to pattern the underlying layer, wherein the trim process includes etching the oxide spacers to reduce a width of each of the oxide spacers.

9. The method of claim 1, wherein the forming the plurality of mandrels includes forming at least one of a plurality of polysilicon mandrels.

10. A method of semiconductor device fabrication, comprising:
    forming a plurality of mandrels on a semiconductor substrate;
    oxidizing a portion of each of the plurality of mandrels to form an oxidized portion and a residual mandrel;
    etching the oxidized portion to form oxide spacers on each opposing sidewall surfaces of a residual mandrel structure, the residual mandrel structure remaining after the oxidizing process, wherein the oxide spacers have a first width after the etching;

after the etching to form oxide spacers of the first width, performing a trim etch process on the oxide spacers to decease a width of each of the oxide spacers to a second width;

removing the residual mandrel from the semiconductor substrate after the trim etch; and after removing the residual mandrel, using the oxide spacers to define a pattern for fin elements of a fin-type field effect transistor.

11. The method of claim 10, wherein the etching the oxidized portion to form oxide spacers forms oxide spacers having a substantially equal pitch.

12. The method of claim 10, wherein the using oxide spacers to define the pattern includes:

using the oxide spacers as a masking element for etching an underlying insulating layer; and using the etched underlying insulating layer as a masking element for etching the semiconductor substrate to form the fin elements.

13. The method of claim 12, wherein the etching the underlying insulating layer and the etching the semiconductor substrate are performed in-situ.

14. The method of claim 10, wherein the forming the plurality of mandrels include forming mandrels having a height less than approximately 300 Angstroms (Å).

15. The method of claim 10, further comprising using the oxide spacers to define the pattern for fin elements in a nitride insulating layer.

16. A method, comprising:

forming a plurality of substantially equal pitch mandrels on a semiconductor substrate;

exposing the semiconductor substrate having the plurality of mandrels to an oxidation process, wherein the oxidation process oxidizes each of the plurality of mandrels to form an oxidized portion in each sidewall of each of the plurality of mandrels wherein the oxidized portion on each sidewall has a first width;

etching the oxidized portions to form a second width on each sidewall thereby providing oxidized spacer elements;

after etching the oxidized portions, removing the non-oxidized portion of the plurality of mandrels from the semiconductor substrate; and using the oxidized spacer elements having the second width as a masking element to pattern an underlying layer.

17. The method of claim 16, wherein the patterned underlying layer is used as a masking element to etch fin structures in the semiconductor substrate.

18. The method of claim 17, further comprising:

forming a gate structure on each of the fin structures.

19. The method of claim 16, wherein the underlying layer includes a nitride insulating layer and a pad oxide layer.

20. The method of claim 10, the using the oxidized spacer elements includes:

using the oxidized spacer elements as masking elements to etch a first insulating layer, the first insulating layer directly interfacing the oxidized portion;

using the etched first insulating layer as a masking element to etch a second insulating layer, the second insulating layer under and interfacing the first insulating layer; and using the etched second insulating layer as a masking element to etch the semiconductor substrate.

* * * * *